United States Patent
Moody

(10) Patent No.: US 9,287,237 B2
(45) Date of Patent: *Mar. 15, 2016

(54) HERMETICALLY SEALED WAFER PACKAGES

(71) Applicant: RAYTHEON COMPANY, Waltham, MA (US)

(72) Inventor: Cody B. Moody, Frisco, TX (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/640,219

(22) Filed: Mar. 6, 2015

(65) Prior Publication Data

US 2015/0262967 A1 Sep. 17, 2015

Related U.S. Application Data

(63) Continuation of application No. 13/163,935, filed on Jun. 20, 2011, now Pat. No. 8,975,105.

(51) Int. Cl.
*H01L 21/30* (2006.01)
*H01L 21/46* (2006.01)
(Continued)

(52) U.S. Cl.
CPC .............. *H01L 24/83* (2013.01); *H01L 21/563* (2013.01); *H01L 23/10* (2013.01); *H01L 24/03* (2013.01); *H01L 24/09* (2013.01); *H01L 24/29* (2013.01); *H01L 24/32* (2013.01); *H01L 24/94* (2013.01);
(Continued)

(58) Field of Classification Search
None
See application file for complete search history.

(56) References Cited

U.S. PATENT DOCUMENTS 6,335,271 B1 1/2002 Fukuyama
7,569,926 B2 8/2009 Carlson et al.
(Continued)

FOREIGN PATENT DOCUMENTS

KR 100976812 B1 8/2010
WO 2006052763 A2 5/2006
WO 2010126448 A2 11/2010

OTHER PUBLICATIONS

N. Belov et al.; Thin-Layer Au—Sn Solder Bonding Process for Wafer-Level Packaging, Electrical Interconnections and MEMS Applications; Interconnect Technology Conference; 2009; pp. 128-130.

(Continued)

*Primary Examiner* — Calvin Choi
(74) *Attorney, Agent, or Firm* — Burns & Levinson LLP; Joseph M. Maraia

(57) ABSTRACT

Hermetically sealed semiconductor wafer packages that include a first bond ring on a first wafer facing a complementary surface of a second bond ring on a second wafer. The package includes first and second standoffs of a first material, having a first thickness, formed on a surface of the first bond ring. The package also includes a eutectic alloy (does not have to be eutectic, typically it will be an alloy not specific to the eutectic ratio of the elements) formed from a second material and the first material to create a hermetic seal between the first and second wafer, the eutectic alloy formed by heating the first and second wafers to a temperature above a reflow temperature of the second material and below a reflow temperature of the first material, wherein the eutectic alloy fills a volume between the first and second standoffs and the first and second bond rings, and wherein the standoffs maintain a prespecified distance between the first bond ring and the second bond ring.

12 Claims, 3 Drawing Sheets

(51) Int. Cl.
*H01L 21/00* (2006.01)
*H01L 23/00* (2006.01)
*H01L 21/56* (2006.01)
*H01L 23/10* (2006.01)
*H01L 25/065* (2006.01)
*H01L 25/00* (2006.01)

(52) U.S. Cl.
CPC ............ *H01L 25/0657* (2013.01); *H01L 25/50* (2013.01); *H01L 2224/04026* (2013.01); *H01L 2224/05551* (2013.01); *H01L 2224/05555* (2013.01); *H01L 2224/05568* (2013.01); *H01L 2224/26135* (2013.01); *H01L 2224/29023* (2013.01); *H01L 2224/29035* (2013.01); *H01L 2224/2957* (2013.01); *H01L 2224/29562* (2013.01); *H01L 2224/29609* (2013.01); *H01L 2224/29611* (2013.01); *H01L 2224/29624* (2013.01); *H01L 2224/29644* (2013.01); *H01L 2224/29686* (2013.01); *H01L 2224/32055* (2013.01); *H01L 2224/32148* (2013.01); *H01L 2224/32502* (2013.01); *H01L 2224/32506* (2013.01); *H01L 2224/8309* (2013.01); *H01L 2224/8314* (2013.01); *H01L 2224/83054* (2013.01); *H01L 2224/83139* (2013.01); *H01L 2224/83191* (2013.01); *H01L 2224/83192* (2013.01); *H01L 2224/83805* (2013.01); *H01L 2224/83815* (2013.01); *H01L 2224/83825* (2013.01); *H01L 2224/83948* (2013.01); *H01L 2224/94* (2013.01); *H01L 2924/01032* (2013.01); *H01L 2924/01322* (2013.01)

(56) References Cited

U.S. PATENT DOCUMENTS

| | | | |
|---|---|---|---|
| 7,807,547 | B2 | 10/2010 | Summers |
| 8,975,105 | B2 * | 3/2015 | Moody .......................... 438/51 |
| 2003/0104651 | A1 | 6/2003 | Kim et al. |
| 2008/0067652 | A1 | 3/2008 | Menard et al. |
| 2009/0301749 | A1 | 12/2009 | Tanaka et al. |
| 2011/0024923 | A1 | 2/2011 | Foster et al. |
| 2011/0042761 | A1 | 2/2011 | Karlin et al. |
| 2011/0193231 | A1 | 8/2011 | Elenius et al. |

OTHER PUBLICATIONS

Martin A. Schmidt; Wafer-to-Wafer Bonding for Microstructure Formation; Proceedings of the IEEE; vol. 86; No. 8; Aug. 1998.
Frank Niklaus; Adhesive Wafer Bonding for Microelectronic and Microelectromechanical Systems; School of Electrical Engineering, Royal Institute of Technology, Stockholm, Sweden; Jan. 2002.

* cited by examiner

HERMETICALLY SEALED WAFER PACKAGES

CROSS-REFERENCE TO RELATED APPLICATIONS

This application is a continuation of U.S. patent application Ser. No. 13/163,935, filed on Jun. 20, 2011 and entitled "HERMETICALLY SEALED WAFER PACKAGES" issued as U.S. Pat. No. 8,975,105 on Mar. 10, 2015, the entirety of which is hereby incorporated by reference.

FIELD OF THE INVENTION

The currently described invention relates to systems and methods for wafer bonding.

BACKGROUND

Wafer level packaging methods involve simultaneously bonding a lid over every circuit on a base wafer. A single lid wafer (comprising a plurality of lids) is bonded over the base wafer to package each circuit. Prior art packaging methods require removing oxides from the bonding interfaces prior to bonding. Oxide removal is a difficult process that is imperfect and typically reduces processing yield.

A need therefore exists for improved methods and systems for bonding wafers together.

SUMMARY

One embodiment is a method for bonding together two semiconductor wafers. The method includes forming a first bond ring on a first wafer and forming a second bond ring on a second wafer, wherein a surface of the second bond ring faces a complementary surface of the first bond ring. The method also includes forming a first and second standoff of a first material, having a first thickness, on the surface of the first bond ring. The method also includes forming a layer of a second material, having a second thickness, between the first and second standoff on the surface of the first bond ring or the second bond ring, wherein the second material has a reflow temperature less than reflow temperature of the first material. The method also includes heating the first and second wafers to a temperature above the reflow temperature of the second material and below the reflow temperature of the first material causing the second material to reflow and create a hermetic seal between the first and second bond ring, wherein the standoffs maintain a prespecified distance between the first bond ring and the second bond ring. The method also includes cooling the first and second wafers below the reflow temperature to solidify the hermetic seal.

In some embodiments, the method includes applying pressure to the first and second wafers to bring the first and second wafers together before or after heating the first and second wafers. In some embodiments, the method includes annealing the first and second materials, causing the first material to diffuse into the second material to create a eutectic alloy that creates the hermetic seal. In some embodiments, the method includes depositing a layer of a third material over the layer of a second material to reduce oxidation of the layer of a second material.

In some embodiments, prior to heating the first and second materials, a gap is created between the first and second standoffs and the second bond ring when the second wafer is positioned over the first wafer. In some embodiments, the first bond ring geometry is the same as the second bond ring geometry. In some embodiments, the method includes forming the second layer of the second material with a volume of the second material that is greater than a cavity defined by the first and second standoffs and the first and second bond rings. In some embodiments, the method includes forming the second layer of the second material with a volume of the second material that is less than a cavity defined by the first and second standoffs and the first and second bond rings.

Another embodiment is a hermetically sealed semiconductor wafer package. The wafer package includes a first bond ring on a first wafer and a second bond ring on a second wafer, wherein a surface of the second bond ring faces a complementary surface of the first bond ring. The wafer package also includes first and second standoffs of a first material, having a first thickness, formed on a surface of the first bond ring. The wafer package also includes a eutectic alloy formed from a second material and the first material to create a hermetic seal between the first and second wafer, the eutectic alloy formed by heating the first and second wafers to a temperature above a reflow temperature of the second material and below a reflow temperature of the first material, wherein the eutectic alloy fills a volume between the first and second standoffs and the first and second bond rings, and wherein the standoffs maintain a prespecified distance between the first bond ring and the second bond ring.

In some embodiments, prior to heating the first and second materials, a gap is created between the first and second standoffs and the second bond ring when the second wafer is positioned over the first wafer. In some embodiments, the first bond ring geometry is the same as the second bond ring geometry.

Other aspects and advantages of the current invention will become apparent from the following detailed description, taken in conjunction with the accompanying drawings, illustrating the principles of the invention by way of example only.

BRIEF DESCRIPTION OF THE DRAWINGS

The foregoing features of various embodiments of the invention will be more readily understood by reference to the following detailed descriptions in the accompanying drawings, in which.

DETAILED DESCRIPTION OF ILLUSTRATIVE EMBODIMENTS

Figure 1:
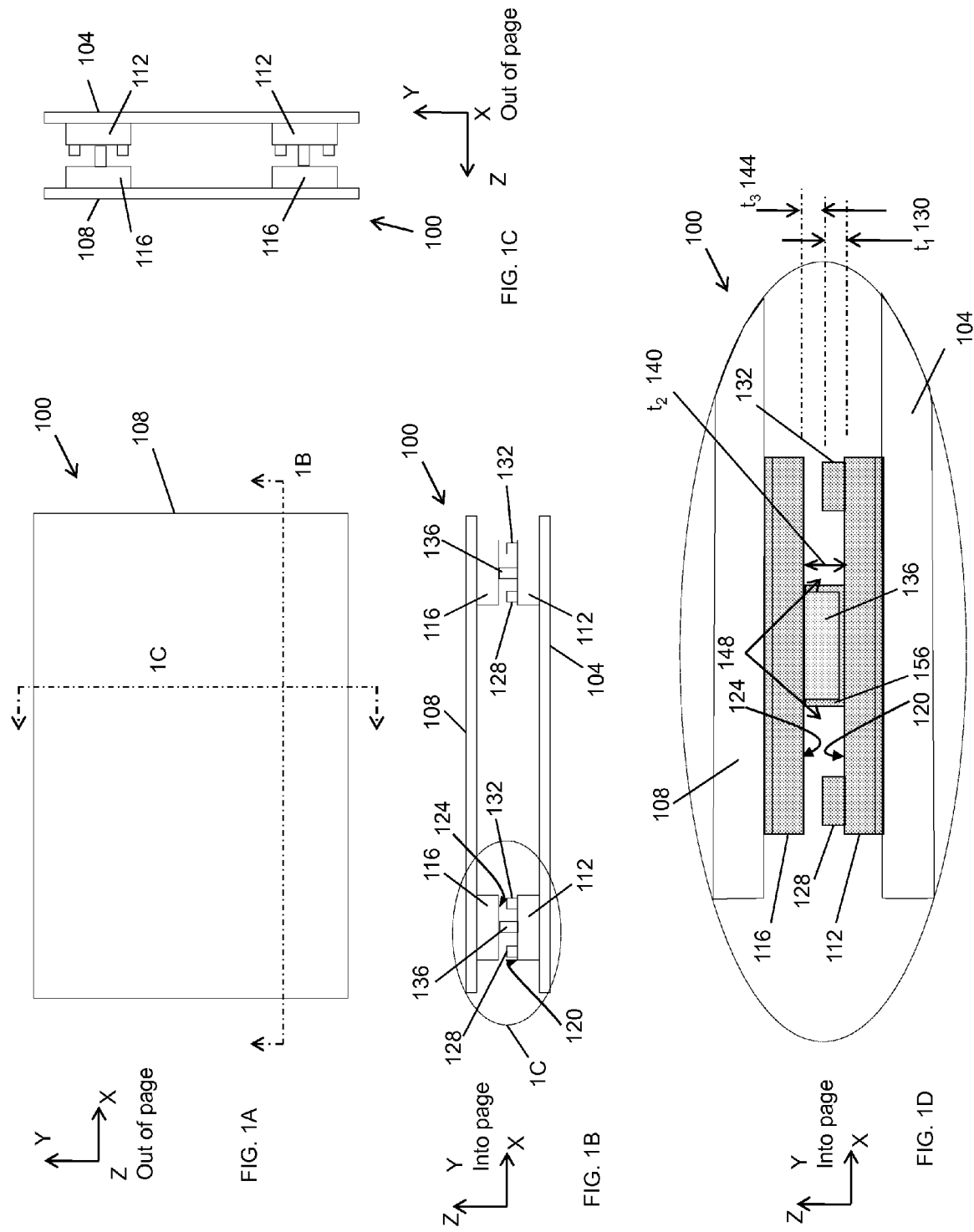
FIG. 1A is a schematic illustration of a top view of a partially assembled wafer package, according to an illustrative embodiment.
FIG. 1B is a schematic illustration of a side view of the partially assembled wafer package of FIG. 1A, according to an illustrative embodiment.
FIG. 1C is a schematic illustration of a side view of the partially assembled wafer package of FIG. 1A, according to an illustrative embodiment.
FIG. 1D is a schematic illustration of a blown up portion of the partially assembled wafer package of FIG. 1B, according to an illustrative embodiment.

FIGS. 1A, 1B, 1C and 1D are schematic illustrations of a partially assembled wafer package 100, according to an illustrative embodiment. The wafer package 100 is depicted prior to bonding the components together as described below with respect to FIGS. 2 and 3. FIG. 1A is a top view (in the X-Y plane) of the wafer package 100. FIG. 1B a side view (in the Z-X plane) of the wafer package 100. FIG. 1C is a side view (in the Y-Z plane) of the wafer package 100. FIG. 1D is a blown up view (in the Z-X plane) of a portion of the partially assembled wafer package 100 of FIG. 1B. The wafer package 100 includes a first wafer 104 and a second wafer 108. The wafer package 100 also includes a first bond ring 112 on the first wafer 104. The wafer package 100 also includes a second bond ring 116 on the second wafer 108. A surface 124 of the second bond ring 116 faces a complementary surface 120 of the first bond ring 116. The thickness (dimension along the Z-axis) of the bond rings 112 and 116 are specified based on particular design requirements and properties of the wafer package 100. Typical thicknesses for wafer packages range between about 100 nm to about 10 μm.

The wafer package 100 also includes a first standoff 128 and a second standoff 132 of a first material having a first thickness ($t_1$) 130. The standoffs 128 and 132 maintain a predefined distance ($t_1$) between the first bond ring 112 and the second bond ring 116. Thickness ($t_1$) ranges typically ranges between about 100 nm to about 10 μm. The width (dimension along the X-axis) of the standoffs 128 and 132 are specified based on particular design requirements and properties of the wafer package 100. Typical widths for wafer packages range between about 5 μm to about 100 μm. The first and second standoffs (128, 132) along the X-axis are located on the surface 120 of the first bond ring 112. The wafer package 100 also includes a layer 136 of a second material having a second thickness ($t_2$) 140. Thickness ($t_1$) ranges typically ranges between about 100 nm to about 10 μm. With respect to FIG. 1D, when the second wafer is positioned over the first wafer, a gap 144 ($t_3$) is created between the first and second standoffs and the second bond ring. Thickness ($t_1$) ranges typically ranges between about 100 nm to about 10 μm. The layer 136 is located between the first and second standoffs (128, 132) on the surface 120 of the first bond ring 104. In one embodiment, the second material has a reflow temperature less than the reflow temperature of the first material of the first and second standoffs (128, 132). In an alternative embodiment, the layer 136 is located between the first and second standoffs (128, 132) along the X-axis on the surface 124 of the second bond ring 104.

In some embodiments, the wafer package 100 also includes an optional layer 156 of material that is deposited on the layer 136. The optional layer 156 of material is a layer of non-reactive or less reactive material (e.g., 800 Angstroms of Au). The optional layer 156 covers or encapsulates the layer 136 to prevent or minimize oxidation of the layer 136 during processing or handling.

Figure 2:
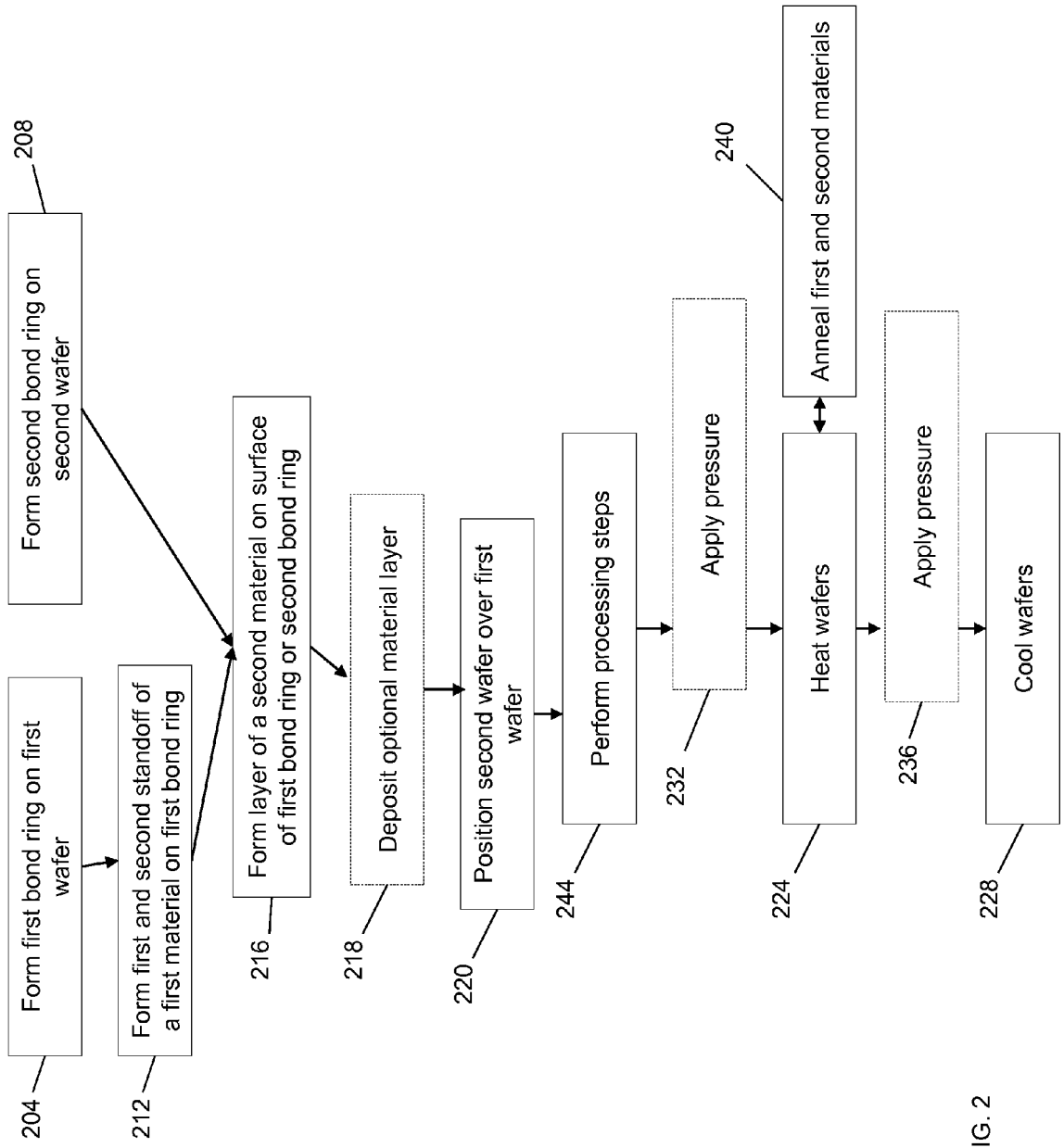
FIG. 2 is a flowchart of a method for bonding together semiconductor wafers, according to an illustrative embodiment.

FIG. 2 is a flowchart of a method for bonding together semiconductor wafers (e.g., wafers 104 and 108 of FIG. 1B), according to an illustrative embodiment. The method includes forming 204 a first bond ring on a first wafer (e.g., bond ring 112 on wafer 104 of FIG. 1B)). The method also includes forming 208 a second bond ring on a second wafer (e.g., bond ring 116 on wafer 108 of FIG. 1B). The method also includes forming 212 a first and second standoff (of a first material) on a surface of the first bond ring (e.g., first standoff 128, second standoff 132 on surface 120 of the first bond ring 112 of FIG. 1D).

Various fabrication techniques can be used to manufacture the packages described herein. For example, various methods, including deposition methods (e.g., evaporation, sputter deposition, chemical vapor deposition, physical vapor deposition, molecular beam epitaxy, plating), can be used to form the bond rings, standoffs, and other material layers. In some embodiments, photolithographic techniques that involve masking layers and etching steps can be used to form the different material layers and components.

The method also includes forming 216 a layer of a second material (e.g., layer 136 of FIG. 1D) on the surface of the first bond ring (e.g., bond ring 112) or second bond ring (e.g., bond ring 116), between the first and second standoffs. The second material has a reflow temperature less than the reflow temperature of the first material. In some embodiments, the method includes the optional step depositing 218 a layer of material (e.g., optional layer 156 of FIG. 1) over the layer of second material. The optional layer of material is a layer of non-reactive or less reactive material that covers or encapsulates the layer of a second material to prevent or minimize oxidation of the layer of a second material during processing or handling.

The method also includes performing one or more processing steps 244 that purges unwanted atmosphere from the chamber housing the wafer components. The processing steps 244 also include replacing the purged atmosphere with a desired processing gas or a vacuum. Processing steps 244 are performed with a gap between the surface of the first wafer and the second wafer so the wafers are not in contact with each other. The processing steps 244 also include providing a forming gas (e.g., a gas including hydrogen) to the wafers and elevating the temperature of the wafers to a temperature below the melting temperature of the layer of a second material (e.g., layer 136 of FIG. 1D). The processing steps 244 aide with the reduction of oxides on the surfaces of the wafer.

The method also includes positioning 220 the second wafer over the first wafer so the surface of the second bond ring faces the complementary surface of the first bond ring (as depicted in, for example, FIG. 1B, where surface 124 of the second bond ring 116 is positioned to face surface 120 of the first bond ring 112). FIG. 1B also illustrates the wafer package after the second wafer has been positioned over the first wafer (prior to annealing the wafers). With respect to FIG. 1D, when the second wafer is positioned over the first wafer, a gap 144 is created between the first and second standoffs and the second bond ring. The gap 144 is established based on the difference in thickness (along the Z-axis) of the standoffs and the layer of the second material.

Figure 3:
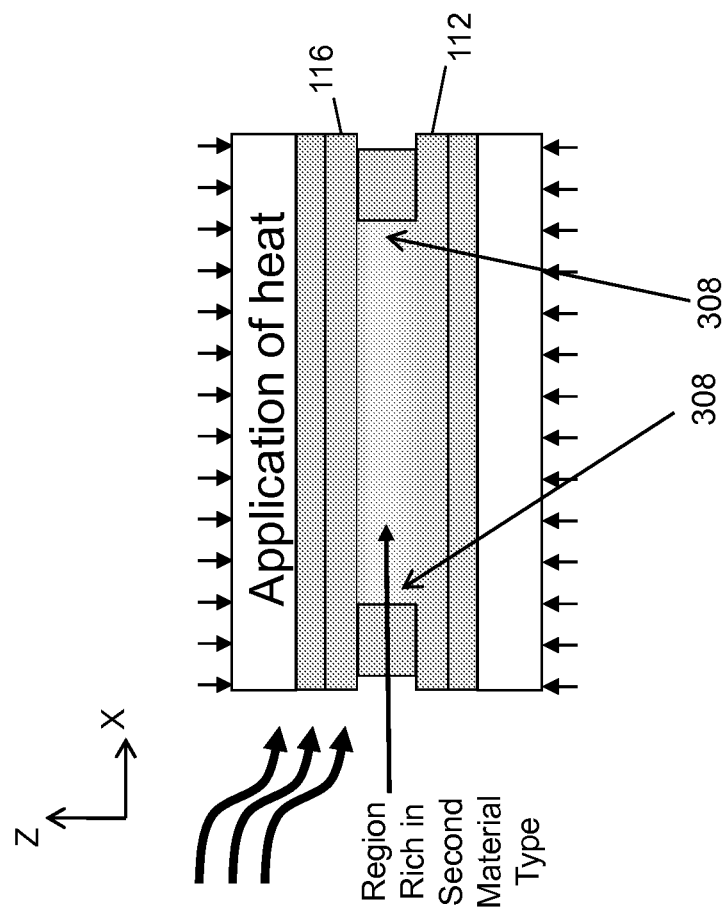
FIG. 3 is a schematic illustration of a blown up portion of a wafer package after annealing the wafers, according to an illustrative embodiment.

The method also includes heating the first and second wafers 224. In this embodiment (and as depicted in FIG. 3), the heat is applied to the first and second wafers to a temperature above the reflow temperature of the second material (e.g., layer 136 of FIG. 1D) and below the reflow temperature of the first material (e.g., first standoff 128 and a second standoff 132 of FIG. 1D formed from the first material). The second material reflows and creates a hermetic seal 308 between the first and second bond rings (e.g., bond rings 112 and 116). In the event that a contaminant or oxide is present during fabrication that prevents some portion of the second material from diffusing into the first material, the flow of the second material into the gaps formed between standoffs 128, 132 and layer 136 (i.e., lower reflow temperature material) will still form a seal between the standoffs and the bond rings.

In some embodiments, the layer of the second material is formed with a volume of the second material that is greater than a cavity (e.g., cavity 148 of FIG. 1D) defined by the first and second standoffs and the first and second bond rings. In some embodiments, the method also includes annealing the first and second materials 240, causing the first material to diffuse into the second material to create a eutectic alloy that creates the hermetic seal. Various material types can be used for the first and second materials. Exemplary first/second material pairs and the nominal temperature at which the second material begins to diffuse into the first material are, for example, Au/In (156° C.), Au/Sn (280° C.), Au/Ge (361° C.), Au/Si (370° C.), Al/Ge (419° C.) and Al/Si (580° C.).

The method also includes cooling the first and second wafers 228, for example, below the reflow temperature of the second material. In some embodiments, the method also includes the optional step of applying pressure to the first and second wafers to bring the first and second wafers together and cause the second material to flow and fill gaps and the cavity between the two wafers. Step 232 involves applying pressure to the first and second wafers before heating the wafers. Step 236 involves applying pressure to the first and second wafers after heating the wafers. In some embodiments, the method includes applying pressure before applying heat, after applying heat, or both.

Comprise, include, and/or plural forms of each are open ended and include the listed parts and can include additional parts that are not listed. And/or is open ended and includes one or more of the listed parts and combinations of the listed parts.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

The invention claimed is:

1. A method for bonding together two semiconductor wafers, the method comprising:
   forming a first bond ring on a first wafer;
   forming a second bond ring on a second wafer, wherein a surface of the second bond ring faces a complementary surface of the first bond ring;
   forming first and second standoffs of a first material, having a first thickness, on the surface of the first bond ring;
   forming a layer of a second material, having a second thickness, between the first and second standoffs on the surface of the first bond ring or the second bond ring; and
   forming a eutectic alloy from the second and the first material to create a hermetic seal between the first and second wafers, the eutectic alloy formed by heating the first and second wafers to a temperature above a reflow temperature of the second material, causing the second material to reflow and create a hermetic seal between the first bond ring and the second bond ring, wherein the first and second standoffs maintain a pre-specified distance between the first bond ring and the second bond ring.

2. The method of claim 1, comprising applying pressure to the first and second wafers to bring the first and second wafers together before or after heating the first and second wafers.

3. The method of claim 1, comprising depositing a layer of a third material over the layer of a second material to reduce oxidation of the layer of a second material.

4. The method of claim 1, wherein prior to heating the first and second materials, a gap is created between the first and second standoffs and the second bond ring when the second wafer is positioned over the first wafer.

5. The method of claim 1, wherein a first bond ring geometry is the same as a second bond ring geometry.

6. The method of claim 1, comprising forming the second layer of the second material with a volume of the second material that is greater than a cavity defined by the first and second standoffs and the first and second bond rings.

7. The method of claim 1, comprising forming the second layer of the second material with a volume of the second material that is less than a cavity defined by the first and second standoffs and the first and second bond rings.

8. The method of claim 1, comprising cooling the first and second wafers below the reflow temperature of the second material to solidify the hermetic seal.

9. A hermetically sealed semiconductor wafer package, the package comprising:
   a first bond ring on a first wafer;
   a second bond ring on a second wafer, wherein a surface of the second bond ring faces a complementary surface of the first bond ring;
   first and second standoffs of a first material, having a first thickness, formed on the surface of the first bond ring; and
   a eutectic alloy formed between the first and second standoffs and the first and second bond rings from a second material and the first material to create a hermetic seal between the first and second wafers, the eutectic alloy formed by heating the first and second materials to a temperature above a reflow temperature of the second material.

10. The package of claim 9, wherein prior to heating the first and second materials, a gap is created between the first and second standoffs and the second bond ring when the second wafer is positioned over the first wafer.

11. The package of claim 9, wherein a first bond ring geometry is the same as a second bond ring geometry.

12. A method of bonding together two semiconductor wafers, the method comprising:
   forming a first bond ring on a surface of a first wafer;
   forming a second bond ring on a surface of a second wafer, wherein a surface of the second bond ring faces a complementary surface of the first bond ring;
   forming first and second standoffs of a same first material, each having a same first thickness, on the first bond ring surface;
   forming a layer of a second material, having a second thickness, between the first and second standoffs on the surface of the first bond ring or the surface of the second bond ring;
   heating the first and second wafers to a temperature above a reflow temperature of the second material, causing the second material to reflow, and forming a eutectic alloy comprising the first and second materials and creating a hermetic seal between the first and second bond rings; and
   annealing the first and second materials, causing the first material to diffuse into the second material,
   wherein the first and second standoffs maintain a pre-specified distance between the first and second bond rings.

* * * * *